US005498969A

United States Patent [19]

Huyart et al.

[11] Patent Number: 5,498,969

[45] Date of Patent: Mar. 12, 1996

[54] DEVICE FOR THE VECTOR MEASUREMENT OF ULTRA-HIGH FREQUENCY SIGNALS OF THE SAME ANGULAR FREQUENCY OF THE SIX PORT JUNCTION TYPE

[75] Inventors: Bernard Huyart, Lognes, France; Frank Wiedmann, Vaihingen, Germany

[73] Assignee: France Telecom Etablissement Autonome De Droit Public, Paris, France

[21] Appl. No.: 270,428

[22] Filed: Jul. 5, 1994

[30] Foreign Application Priority Data

Jul. 9, 1993 [FR] France .................................. 93 08465

[51] Int. Cl.[6] ................................................ G01R 27/04

[52] U.S. Cl. ........................... 324/638; 324/84; 333/109

[58] Field of Search ..................... 324/84, 638; 333/109, 333/112, 117, 118, 130, 136

[56] References Cited

U.S. PATENT DOCUMENTS

| | | | |
|---|---|---|---|
| 4,001,681 | 1/1977 | Hoer et al. . | |
| 4,104,583 | 8/1978 | Engen | 324/638 |
| 4,427,936 | 1/1984 | Riblet et al. | 324/638 |
| 4,521,728 | 6/1985 | Li | 324/638 |
| 4,641,082 | 2/1987 | Griffin et al. | 333/109 X |
| 4,769,592 | 9/1988 | Potter et al. | 324/638 |
| 5,170,126 | 12/1992 | Wedge et al. | 324/638 X |
| 5,274,333 | 12/1993 | Ghannouchi et al. | 324/638 |

OTHER PUBLICATIONS

"A Semiautomated Six Port for Measuring Millimeter–Wave Power and Complex Reflection Coefficient", Manly P. Weidman, IEEE Trans. Microwave Theory Tech., Jul. 1977, pp. 1083–1085.

"A Six–Port Automatic Network Analyzer", Harry M. Cronson et al, IEEE Trans. Microwave Theory Tech., Dec. 1977, pp. 1086–1091.

Microwave Journal, vol. 34, No. 11, Nov. 1991, Norwood, MA, pp. 102–114, Kamarei, "Vector Voltmeter Applications Microwave Imaging".

IEEE MTT–S Int. Microwave Symposium Digest Piscataway, New York, 1980, pp. 431–433, Riblet, "Transmission Phase Measurements With A Single Six–Port".

*Primary Examiner*—Kenneth A. Wieder
*Assistant Examiner*—Diep Do
*Attorney, Agent, or Firm*—Pearne, Gordon, McCoy & Granger

[57] ABSTRACT

The present invention relates to a device for the vector measurement of ultra-high frequency signals of the same angular frequency of the six port junction type, comprising a power divider (10) and a phase shifting circuit (11) two of the six ports of said device being measuring ports connectable to two sources of signals to be characterized, the four other ports being connected to four detectors, one of them being a matched detector (14) and the three others (12, 13, 15) being unmatched detectors.

8 Claims, 3 Drawing Sheets

DET
15
DET
12
DET
13
DET
14
11
10
L1
L2
C
$R_1$
$R_2$
$R_{01}$
$R_{02}$
$V_{11'}$
$V_{22'}$
1
1'
2
2'

□ 04
+ 05
◇ 06 f1: 500 MHz
f2: 3 GHz

DEVICE FOR THE VECTOR MEASUREMENT OF ULTRA-HIGH FREQUENCY SIGNALS OF THE SAME ANGULAR FREQUENCY OF THE SIX PORT JUNCTION TYPE

DESCRIPTION

1. Technical Field

The present invention relates to a device for the vector measurement of ultra-high-frequency signals of the same angular frequency and of the six port junction type. Such a device can be produced in monolithic integrated microwave (MMIC) or monolithic hybrid integrated microwave (MHMIC) technology.

2. Prior Art

Six port-type measuring devices are described in the three following articles:

- an article by B. Huyart, H. Richard, E. Bergeault, L. Jallet, Y, Delisle, R. G. Bosisio, entitled "Dispositif de mesure intégré"", (documentation of the Conférence des huitiemes Journées nationales micro-ondes, JNM 1993, Brest, May 12–14 1993);
- an article by M. N. Solomon, P. S. Weitzman, C. P. McClay and H. M. Cronson, entitled "A Monolithic Six-Port Module" (IEEE Microwave and Guided Wave Letters, vol. 2, No. 8, August 1992);
- an article by V. Bilik, V. Raffay and I. Bezek, entitled "A New Extremely Wideband Lumped Six-Port Reflectometer" (EUMC 91, September 1991).

The prior art devices described in the first two articles by B. Huyart et al and M. S. Solomon et al essentially utilize reactive components (inductances, capacitors) for producing a six port Junction. In MMIC technology, the pass band of the device is then reduced and is approximately equal to 10% of the centre operating frequency. In MHMIC technology, it is possible to obtain wide pass bands, but in this case the circuit is large.

The device described in the third article by V. Bilik et al essentially utilizes passive components (resistors) for producing a six port Junction. Therefore the pass band is large (several decades) and the device is easy to integrate. However, this device suffers from the following disadvantages:

- it has typical losses between the two ports for measuring the ultra-high frequency signals of approximately 14 dB and between said same ports and the four other ports, where the detection diodes are connected, of approximately 16 dB;
- it is very sensitive to frequency variations and the components forming the circuit.

Therefore the latter device is not a satisfactory solution for a MMIC technology construction. Thus, the integrated device is calibrated on the basis of the measurement of standards and this calibration takes place for a specimen, being considered equivalent for all the other integrated devices, no matter what the wafer in a given technology. Therefore the characteristics of the device must be independent of variations of components between individual wafers, which is not the case in practice.

The invention is directed at a monolithic integrated microwave (MMIC) or monolithic hybrid integrated microwave (MHMIC) technology measuring device for an application to the measurement of the vector ratio between two ultra-high frequency signals of the same angular frequency.

DESCRIPTION OF THE INVENTION

The present invention proposes a device for the vector measurement of ultra-high frequency signals of the same angular frequency, of the six port junction type, characterized in that it comprises a power divider and a phase shifting circuit and in that two of the six ports of said device are measuring ports connectable to two sources of signals to be characterized, the four other ports being connected to four detectors, one of the latter being a matched detector and the three others being unmatched detectors.

The two input terminals of the power divider receive the first signal to be characterized. The two terminals of a first port of the phase shifting circuit, between which is located a first detector, receive the second signal to be characterized. Two terminals of a first output of the power divider are connected to two terminals of the second port of the phase shifting circuit, a second detector being connected between these two terminals. The matched detector is connected between the two terminals of a second output of the power divider. A third detector is connected between a first terminal of the first port of the phase shifting circuit and a first terminal of the first port of the power divider.

The device according to the invention can be produced in integrated microwave or hybrid integrated microwave technology.

The power divider is a resistive power divider. The matched detector has an unmatched detector in parallel with a resistor, which is the reference impedance of the ultra-high frequency propagation lines.

The phase shifting circuit comprises at least one phase shifting cell consisting of an all-pass filter. This phase shifting cell is a T cell formed by two inductances at the centre point of which is connected a capacitor, whereof the other electrode is connected to earth or ground.

An unmatched detector advantageously comprises a diode, a capacitor being located between each of the electrodes of the diode and one of the two input terminals which receives the input signal. This diode is continuously supplied by a voltage provided by a power supply in series with a first polarization resistor connected between the earth and the anode of said diode. A low-pass filter is connected in series with a second polarization resistor between earth and the cathode of said diode. The detected voltage is obtained at the terminals of the filter.

Such a device solves the problems caused by the prior art devices.

Thus, it proposes an original electric diagram of a six port junction for the vector measurement of ultra-high frequency signals of the same angular frequency. The pass band of the circuit is approximately three octaves. The power losses between the ports are reduced and the size of the circuit is approximately 1 $mm^2$.

The integration of this measuring device permits the characterization of the MMIC circuit in situ by the incorporation of said device into the MMIC circuit to be tested, or into probes of advanced measuring stations. An advantageous application of said device is the study of the interaction of microwave radiation with matter (materials, biological media) in microgravity, because it can be carried on board satellites, probe balloons, etc. as a result of its reduced dimensions. Another advantage application of this device is its integration into the elements of electronic scanning antennas. The determination of the relative phase between the signals intercepted by the antenna elements permits the automatic pointing of the antenna in the direction of the source.

DETAILED DESCRIPTION OF EMBODIMENTS

Figure 1:
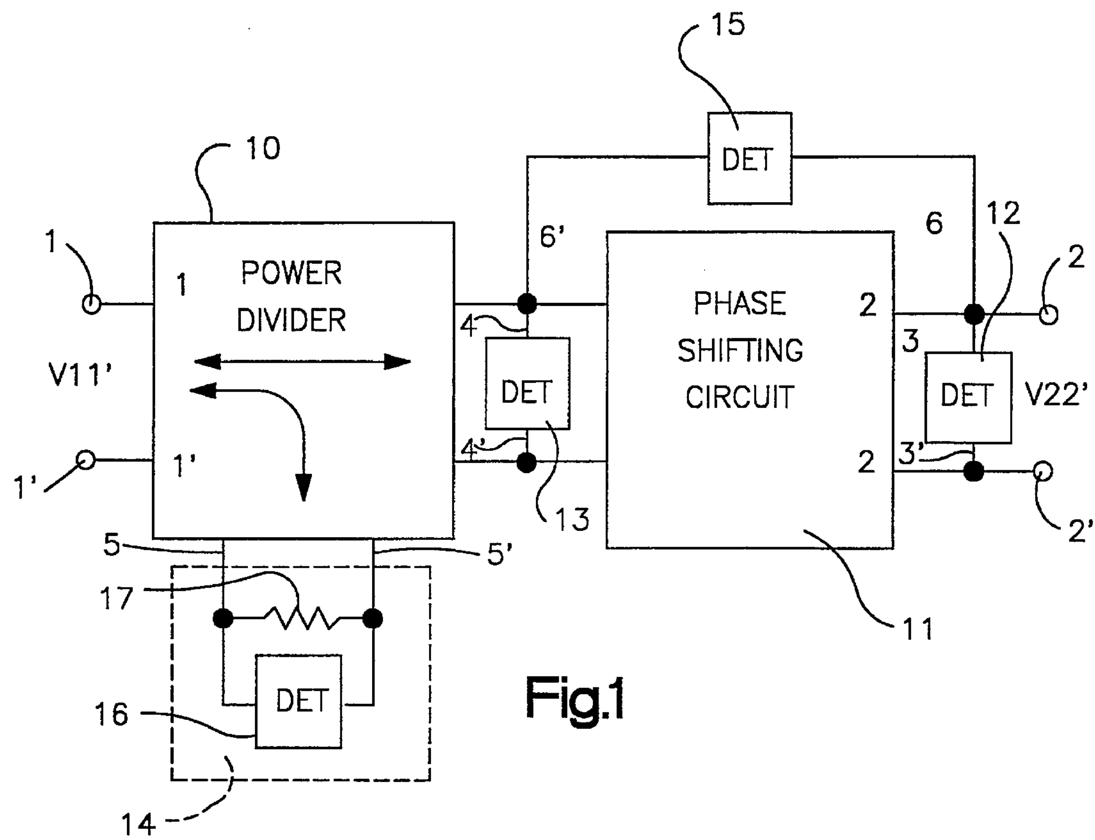
FIG. 1 illustrates the measuring device according to the invention.

The measuring device according to the invention and as shown in FIG. 1 comprises a power divider 10 and a phase shifting circuit 11. In said measuring device, the two input terminals 1, 1' of the power divider 10 receive the first signal to be characterized $V_{11'}$.

The two terminals 2, 2' of a first port of the phase shifting circuit 11, between which is located a first detector 12, receive the second signal to be characterized $V_{22'}$. Two terminals of a first output of the power divider 10 are connected to two terminals of the second port of the phase shifting circuit 11, a second detector 13 being connected between these two terminals.

A matched detector 14 is connected between the two terminals of the second output of the power divider 10. A third detector 15 is connected between a first terminal of the first port of the phase shifting circuit 11 and a first terminal of the second port of the same circuit 11.

Essential features of the invention are in particular the electric diagram of the six port junction of FIG. 1 and the use of "unmatched" detectors. The measurement ports 11' and 22' are connected to two sources of signals to be characterized. The four other ports ii' (i,i'=3, 4, 5, 6) are connected to four detectors 12, 13, 14, 15.

The small number of components used for producing the device explains the wide operating pass band thereof and the reduced size thereof.

The matched detector 14 comprises an unmatched detector 16 in parallel with a resistor 17 such that $Z_0=50\Omega$, which is the reference impedance of ultra-high frequency propagation lines. The detector 16 and the resistor 17 constitute a detector "matched" to the reference impedance and as the internal impedance of the detector is high, the input impedance of the detector is overall equal to $Z_0$.

In the prior art devices, like those described in the aforementioned articles, all the detectors are matched. In the proposed device, the internal impedance of the detectors 12, 13, 15 is not transformed into an impedance equal to $Z_0$. This feature makes it possible to reduce the power losses of the device.

In the mimic diagram of the device according to the invention illustrated in FIG. 1, assuming that two ultra-high frequency signals $V_{11'}$, $V_{22'}$ are present at the ports 11', 22', the voltages $V_{ii'}$ (i=3, 4, 5, 6) at the terminals of the detectors are a linear combination of the voltages $V_{11'}$, $V_{22'}$:

$V_{ii'}=\alpha_i V_{11'}+\beta_i V_{22'}$, with $\alpha_i$, $\beta_i$ complex constants independent of the voltages to be characterized $V_{11'}$, $V_{22'}$.

The detectors supply to the ports ii' of the circuit d.c. voltages proportional to the square modulus of the a.c. voltages $V_{ii'}$. The measurement of these output d.c. voltages makes it possible to determine the vector ratio of the voltages $V_{11'}$, $V_{22'}$ following an appropriate mathematical processing of the measurement data. The proposed electric diagram makes it possible to determine the ratio $V_{11'}/V_{22'}$ without ambiguity in the frequency band 500 MHz to 3 GHZ. This frequency band is fixed by that of the phase shifting circuit.

Figure 2:
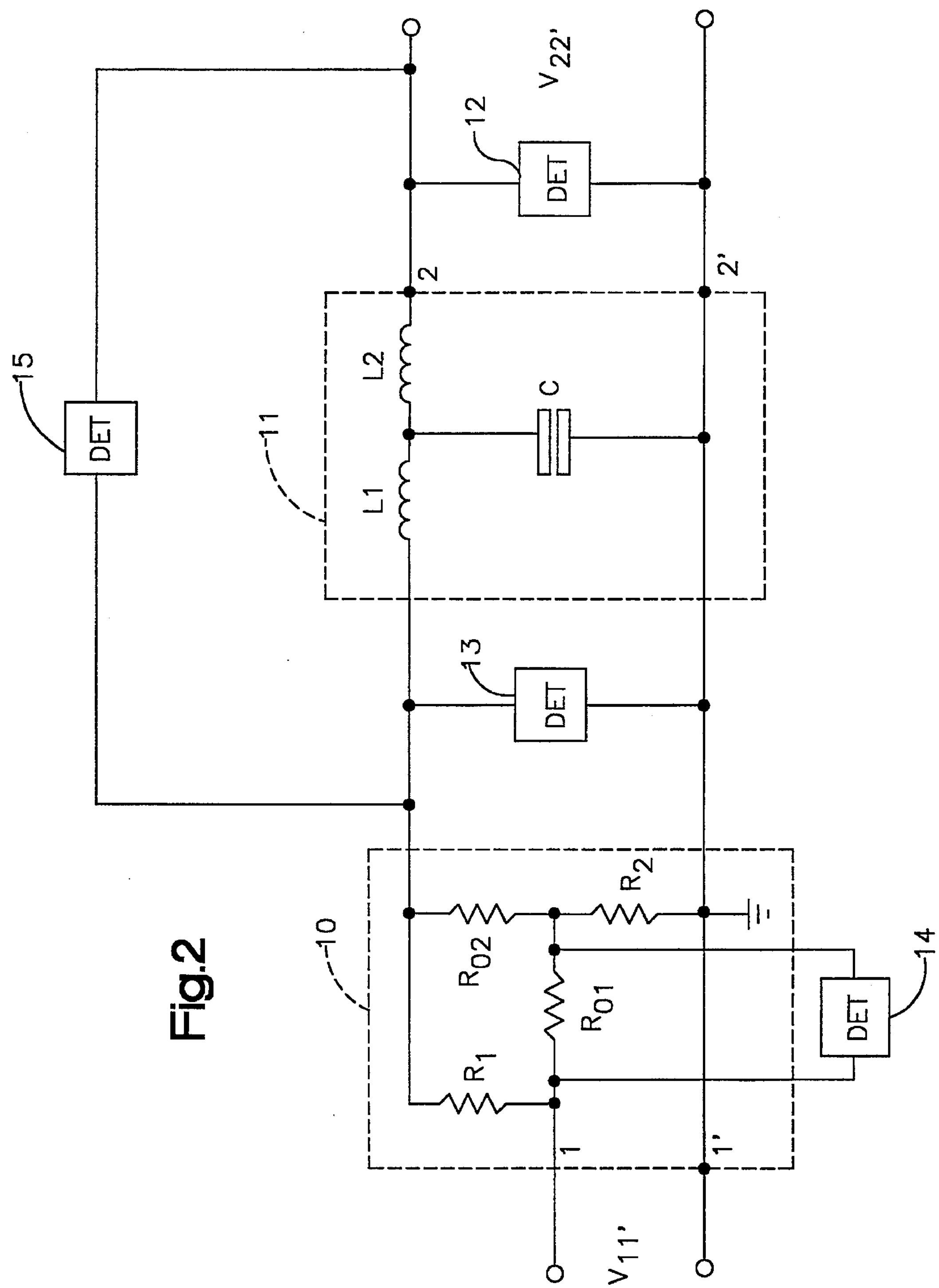
FIG. 2 illustrates an embodiment of the measuring device according to the invention.

FIG. 2 shows the electric diagram of a specific embodiment of the device according to the invention.

The resistors $R_1$, $R_2$, $R_{01}$ and $R_{02}$ constitute the power divider. Provided that the product of $R_1$ and $R_2$ is equal to the square of $R_{02}$, the input impedance of the port 11' is equal to the reference impedance $Z_0=50\Omega$. The values of these resistors are fixed so as to obtain an attenuation of 3 dB between the port 11' and the terminals of the detector 13, which is the optimum value in the chosen MMIC technology. The inductances $L_1$, $L_2$, as well as the capacitor C constitute a low-pass filter and implement the function of the phase shifting circuit. It can be replaced by an all-pass filter. The values of these elements are calculated so as to obtain the requisite phase shift (60°) in the frequency band and the input impedance of the port of 50Ω.

On using several phase shifting cells $L_1$, $L_2$, C like that shown in FIG. 2, we obtain a device able to operate on a decade, e.g. 1 to 10 GHz.

Figure 3:
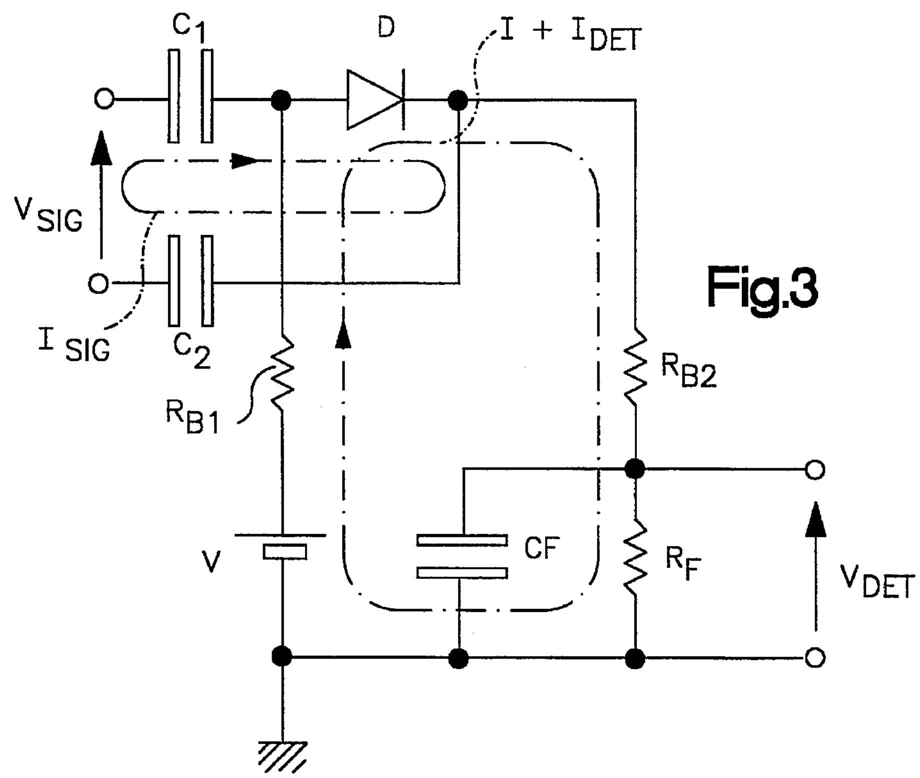
FIG. 3 illustrates an embodiment of detectors used in the measuring device according to the invention.

An electric diagram of unmatched detectors is given in FIG. 3. In this circuit, there is no common earth between the d.c. power supply and the a.c. power supply.

An unmatched detector comprises a diode D, a capacitor $C_1$ or $C_2$ being located between each of the electrodes of the diode D and one of the two input terminals receiving an input signal $V_{sig}$. This diode is continuously supplied by a voltage provided by a power supply V arranged in series with a first polarization resistor $R_{B1}$ connected between earth and the anode of said diode D, a low-pass filter ($R_F$, $C_F$) being connected in series with a second polarization resistor $R_{B2}$ between earth and the cathode of said voltage. The detected voltage $V_{det}$ is obtained at the terminals of the filter.

In this circuit there are two current loops, namely a first a.c. loop $I_{sig}$ and a second d.c. loop $I+I_{det}$.

The technology was chosen in order to obtain a continuous path for the current of the ultra-high frequency signal ($I_{sig}$) and the direct current ($I+I_{det}$). The diodes are of the SCHOTTKY type. The capacitors $C_1$, $C_2$ make it possible to decouple the continuous and ultra-high frequency signals. The resistors $R_{B1}$, $R_{B2}$ make it possible to isolate the ultra-high frequency signals from earth. The resistor $R_F$ and the capacitor $C_F$ constitute a low-pass filter, at whose output is provided the d.c. voltage.

In an embodiment of the invention, consideration is given to the following values:

For the device according to the invention:

$R_1=20$ $R_2=120$ $R_{01}=50$ $R_{02}=50$ $L_1=L_2=1.9$ nH

C=1.5 pF

For each detector:

$C_1=C_2=3$ pF $R_{B1}=R_{B2}=1$K $C_F=1.3$ pF $R_F=10$K

V=0.74 V.

In the frequency band 500 MHz to 3 GHz, the theoretical results provide a transmission loss between the two measurement ports $L_{12}$ equal to +3 dB and transmission losses equal to +12 dB in the worst case between said same measurement ports and the four other ports where the detectors are connected. These losses are designated $L_{ji}$ (j=1, 2 and i=3, 4, 5, 6).

The results simulated on the basis of electrical models of the components from a given source are given in the following table in the same frequency band.

| Values | Typical | Worse case |
|---|---|---|
| $L_{12}$ | 6 dB | 7.2 dB |
| $L_{ij}$ | 5 dB | 15 dB |

The total surface of the circuit is 1.2 $mm^2$ with the four detection diodes connected to four of the six ports of the junction. Assuming that the values of the components of the circuit vary by 10%, the characteristics of the circuit evolve by the same order of magnitude.

In addition, the characteristics of the junction make it possible to obtain a minimum uncertainty on the measurement. Thus, by designating $Q_i=(\alpha_i/\beta_i)$, i=4, 5, 6 with $\alpha_i$, $\beta_i$ complex constants independent of the voltages to be characterized $V_{11'}$, $V_{22'}$, and assuming that the constant $_3$ is zero, it is possible to demonstrate that the ratio of said same voltages $(V_{11'}/V_{22'})$ can be graphically determined on the basis of the intersection point of three circles of centre $Q_i$ and radius $$\frac{|V_{ii'}||\alpha_3|}{|V_{33'}||\beta_i|}$$

equal to the product of the ratio of the moduli of the voltages $V_{ii'}$ and $V_{33'}$ and the ratio of the moduli of the constant $\alpha_3$ and $\beta_i$, in the complex plane $(V_{22'}/V_{11'})$.

Figure 4:
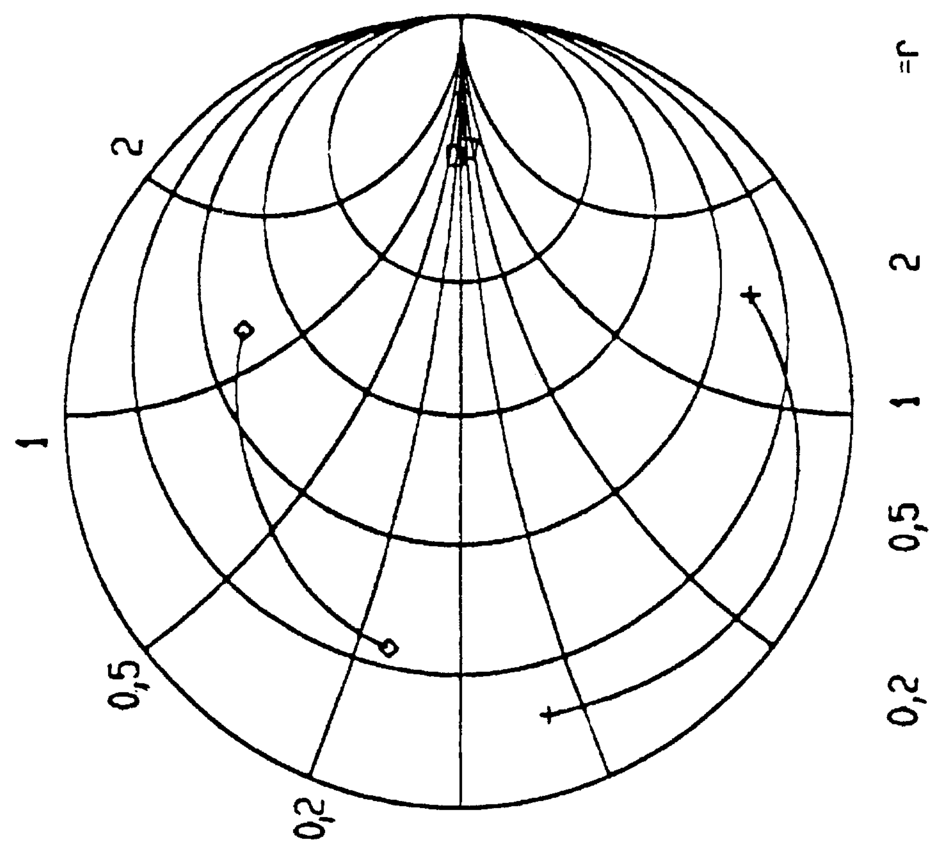
FIG. 4 illustrates the variation of the centres $Q_i$ of representative circles in the complex plane ($V_{22'}/V_{11'}$) in the frequency band 500 MHz to 3 GHz.

The simulated results demonstrate that in the worse case the constant $\beta_3$ is always below $10^{-3}$. Another quality criterion of six port Junctions for the measurement of the vector ratio of signals $V_{22'}$ and $V_{11'}$ is to obtain an equal distribution of the centres $Q_i$ of the circles in the complex plane $(V_{22'}/V_{11'})$, namely a constant modulus and a relative phase shift of 120° between the centres $Q_i$ of the circles. The simulated results of the centres $Q_i$ are graphically shown in FIG. 4 in the complex plane $V_{22'}/V_{11'}$ and in tabulated form in the following table in the frequency band 500 MHz to 3 GHz.

| FREQ-GHZ | Q4 MAG | Q4 ANG | Q5 MAG | Q5 ANG | Q6 MAG | Q6 ANG |
|---|---|---|---|---|---|---|
| 0.50000 | 0.671 | −1.376 | 0.804 | −163.293 | 0.625 | 163.155 |
| 0.60000 | 0.670 | −1.366 | 0.808 | −159.885 | 0.621 | 159.826 |
| 0.70000 | 0.668 | −1.368 | 0.814 | −156.520 | 0.617 | 156.512 |
| 0.80000 | 0.667 | −1.377 | 0.821 | −153.202 | 0.612 | 153.221 |
| 0.90000 | 0.666 | −1.390 | 0.828 | −149.930 | 0.607 | 149.956 |
| 1.00000 | 0.664 | −1.404 | 0.836 | −146.703 | 0.601 | 146.718 |
| 1.10000 | 0.663 | −1.414 | 0.844 | −143.515 | 0.596 | 143.505 |
| 1.20000 | 0.662 | −1.419 | 0.852 | −140.361 | 0.590 | 140.312 |
| 1.30000 | 0.660 | −1.415 | 0.860 | −137.232 | 0.584 | 137.133 |
| 1.40000 | 0.659 | −1.401 | 0.868 | −134.118 | 0.579 | 133.959 |
| 1.50000 | 0.658 | −1.373 | 0.875 | −131.007 | 0.574 | 130.782 |
| 1.60000 | 0.656 | −1.331 | 0.881 | −127.884 | 0.569 | 127.590 |
| 1.70000 | 0.655 | −1.272 | 0.886 | −124.734 | 0.565 | 124.370 |
| 1.80000 | 0.653 | −1.194 | 0.890 | −121.537 | 0.562 | 121.107 |
| 1.90000 | 0.652 | −1.096 | 0.892 | −118.273 | 0.559 | 117.783 |
| 2.00000 | 0.651 | −0.976 | 0.893 | −114.918 | 0.557 | 114.378 |
| 2.10000 | 0.650 | −0.833 | 0.891 | −111.445 | 0.556 | 110.870 |
| 2.20000 | 0.649 | −0.667 | 0.888 | −107.821 | 0.555 | 107.234 |
| 2.30000 | 0.648 | −0.476 | 0.883 | −104.012 | 0.556 | 103.440 |
| 2.40000 | 0.648 | −0.263 | 0.876 | −99.977 | 0.558 | 99.453 |
| 2.50000 | 0.647 | −0.027 | 0.866 | −95.670 | 0.561 | 95.238 |
| 2.60000 | 0.648 | 0.228 | 0.855 | −91.039 | 0.565 | 90.751 |
| 2.70000 | 0.648 | 0.499 | 0.842 | −86.026 | 0.570 | 85.945 |
| 2.80000 | 0.649 | 0.782 | 0.828 | −80.566 | 0.576 | 80.769 |
| 2.90000 | 0.651 | 1.069 | 0.813 | −74.596 | 0.583 | 75.166 |
| 3.00000 | 0.654 | 1.353 | 0.798 | −68.050 | 0.590 | 69.084 |

We claim:

1. Device for the vector measurement of ultra-high frequency signals of the same angular frequency, of the six port junction type, comprising a power divider and a phase shifting circuit, wherein two of the six ports of said device are measurement ports connectable to two sources of signals to be characterized, the four other ports being connected to four detectors, one of the latter being a matched detector and the three others being unmatched detectors.

2. Device according to claim 1, wherein the two input terminals of the power divider receive the first signal to be characterized, the two terminals of a first port of the phase shifting circuit, between which is located a first detector, receive the second signal to be characterized, two terminals of a first output of the phase shifting circuit being connected to two terminals of a second port of the phase shifting circuit, a second detector being connected between said two terminals, the matched detector being connected between the two terminals of a second output of the power divider and a third detector is connected between a first terminal of the first port of the phase shifting circuit and a first terminal of the second port of the same circuit.

3. Device according to claim 1 produced in monolithic integrated or monolithic hybrid integrated microwave technology.

4. Device according to claim 1, wherein the power divider is a resistive power divider.

5. Device according to claim 1, wherein the matched detector comprises an unmatched detector in parallel with a resistor, which is the reference impedance of the ultra-high frequency propagation lines.

6. Device according to claim 1, wherein the phase shifting circuit comprises at least one phase shifting cell consisting of an all-pass filter.

7. Device according to claim 6, wherein said phase shifting cell is a T cell formed by two inductances at the centre point of which is connected a capacitor, whose other electrode is connected to earth.

8. Device according to claim 1, wherein an unmatched detector comprises a diode, a capacitor being located between each of the electrodes of the diode and one of the two input terminals receiving an input signal, said diode being continuously supplied by a voltage delivered by a power supply in series with a first polarization resistor connected between earth and the anode of said diode, a low-pass filter being connected in series with a second polarization resistor between earth and the cathode of said diode, the detected voltage being obtained at the filter terminals.

* * * * *